US006911383B2

(12) United States Patent
Doris et al.

(10) Patent No.: US 6,911,383 B2
(45) Date of Patent: Jun. 28, 2005

(54) HYBRID PLANAR AND FINFET CMOS DEVICES

(75) Inventors: Bruce B. Doris, Brewster, NY (US); Diane C. Boyd, LaGrangeville, NY (US); Meikei Ieong, Wappingers Falls, NY (US); Thomas S. Kanarsky, Hopewell Junction, NY (US); Jakub T. Kedzierski, Peekskill, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 10/604,097

(22) Filed: Jun. 26, 2003

(65) Prior Publication Data

US 2004/0266076 A1 Dec. 30, 2004

(51) Int. Cl.[7] ............... H01L 21/3205; H01L 21/336
(52) U.S. Cl. ............... 438/588; 438/156; 438/258; 438/279
(58) Field of Search ............... 438/156, 258, 438/279, 286, 479, 517, 588

(56) References Cited

U.S. PATENT DOCUMENTS

| | | | | |
|---|---|---|---|---|
| 6,166,413 | A | * 12/2000 | Ono | ............... 257/369 |
| 6,245,615 | B1 | 6/2001 | Noble et al. | |
| 6,252,284 | B1 | * 6/2001 | Muller et al. | ............... 257/412 |
| 6,300,182 | B1 | * 10/2001 | Yu | ............... 438/217 |
| 6,413,802 | B1 | * 7/2002 | Hu et al. | ............... 438/151 |
| 6,657,259 | B2 | * 12/2003 | Fried et al. | ............... 257/350 |
| 2001/0026006 | A1 | 10/2001 | Noble et al. | |
| 2002/0014666 | A1 | 2/2002 | Ohmi et al. | |
| 2002/0063292 | A1 | 5/2002 | Armstrong et al. | |
| 2002/0185676 | A1 | 12/2002 | Momose | |

FOREIGN PATENT DOCUMENTS

| | | | |
|---|---|---|---|
| JP | 62-92361 | 4/1987 | |
| JP | 64-70748 | 3/1989 | |
| JP | 7-183488 | 7/1995 | |
| JP | 2004-088101 | * 3/2004 | ......... H01L/29/786 |

* cited by examiner

Primary Examiner—Amir Zarabian
Assistant Examiner—Pamela E Perkins
(74) Attorney, Agent, or Firm—Scully, Scott, Murphy & Presser; Joseph P. Abate, Esq.

(57) ABSTRACT

The present invention provides an integrated semiconductor circuit containing a planar single gated FET and a FinFET located on the same SOI substrate. Specifically, the integrated semiconductor circuit includes a FinFET and a planar single gated FET located atop a buried insulating layer of an silicon-on-insulator substrate, the planar single gated FET is located on a surface of a patterned top semiconductor layer of the silicon-on-insulator substrate and the FinFET has a vertical channel that is perpendicular to the planar single gated FET. A method of forming a method such an integrated circuit is also provided. In the method, resist imaging and a patterned hard mask are used in trimming the width of the FinFET active device region and subsequent resist imaging and etching are used in thinning the thickness of the FET device area. The trimmed active FinFET device region is formed such that it lies perpendicular to the thinned planar single gated FET device region.

11 Claims, 7 Drawing Sheets

HYBRID PLANAR AND FINFET CMOS DEVICES

BACKGROUND OF INVENTION

The present invention relates to integrated semiconductor devices, and more particularly to an integrated semiconductor circuit that includes a planar single gate complementary metal oxide semiconductor (CMOS) device and a double gate device, i.e., FinFET, which are fabricated on the same semiconductor substrate. In one instance, the planar single gate CMOS device is an nFET formed on a thin silicon-on-insulator (SOI) layer and the FinFET is a pFinFET structure having a vertical channel that has a surface orientation at the (110) direction. Alternatively, the planar single gate CMOS device is a pFET formed on a thin SOI layer with a (110) surface orientation and the FinFET is an nFinFET structure having a vertical channel that has a surface (100) orientation. The present invention also provides a method for fabricating the integrated semiconductor circuit of the present invention.

In present semiconductor technology, complementary metal oxide semiconductor (CMOS) devices, such as nFETs and pFETs, are typically fabricated upon semiconductor wafers in the direction of a single surface orientation. In particular, most semiconductor devices are fabricated on a Si substrate so as to have a (100) surface orientation.

Electrons are known to have a high mobility for a (100) Si surface orientation, but holes are known to have high mobility for a (110) surface orientation. That is, hole mobility values on (100) Si are roughly 2×–4× lower than the corresponding electron hole mobility for this crystallographic orientation. To compensate for this discrepancy, pFETs are typically designed with larger widths in order to balance pull-up currents against the nFET pull-down currents and achieve uniform circuit switching; nFETs with larger widths are undesirable since they take up a significant amount of chip area. On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

Conventional pFETs and nFETs are planar single gate devices that typically have poor sub-threshold voltage characteristics and drive currents for very short channel lengths, compared to double gated devices. Double gated structures offer improved sub-threshold characteristics and drive currents as compared with conventional devices. One type of double-gated device of particular importance is the FinFET. A FinFET is a double-gated device that comprises a tall, yet thin vertical channel region.

Due to the vertical channel structure, a wafer with a (100) surface orientation can be used to fabricate FinFETs with a (110) channel surface orientation. In this case, the pFinFET experiences enhanced mobility with respect to the conventional CMOS device fabricated on a wafer with a (100) surface orientation. However, the nFinFET fabricate on the (100) surface orientation experiences mobility degradation compared to a conventional nFET on the (100) surface channel orientation.

Although it is known to form different types of planar single gated devices or different types of double gated devices on a semiconductor wafer, there exists a need to integrate both planar and FinFET devices on the same wafer in such a fashion that the devices are formed with a surface orientation that enhances the performance of each device. In particular, there is a need for providing an integrated semiconductor circuit that includes at least one nFET as the planar CMOS device and at least one pFinFET as the other device. The pFinFET should be fabricated such that the structure has a surface channel that is oriented at the (110) direction. Alternatively, there is a need for providing a circuit that is comprised of an nFinFET fabricated on a wafer with a (110) surface orientation so that the nFinFET has a (100) surface orientation and a planar pFET device having a (110) surface orientation.

SUMMARY OF INVENTION

One object of the present invention is to provide an integrated semiconductor circuit that includes at least one FinFET device and at least one planar single gated FET device on the same semiconductor substrate.

A further object of the present invention is to provide an integrated semiconductor circuit that includes at least one FinFET device and at least one planar single gated FET device that are fabricated on the same semiconductor substrate in a manner such that each device is oriented in a direction that enhances the performance of the device.

A still further object of the present invention is to provide an integrated semiconductor circuit that comprises an nFET and a pFinFET wherein the pFinFET structure has a (110) surface orientation and the nFET has a (100) surface orientation.

An additional object of the present invention is to provide an integrated semiconductor circuit that comprises a pFET and an nFinFET wherein the pFET structure has a (110) surface orientation.

Another object of the present invention is to provide a simple, yet easy method for providing hybrid planar and FinFET CMOS devices.

These and other objects and advantages are achieved in the present invention by a method in which resist imaging and a patterned hard mask are used in trimming the width of the FinFET active device region and subsequent resist imaging and etching are used in thinning the thickness of the FET device area. The trimmed active FinFET device region is formed such that it lies perpendicular to the thinned FET device region. Moreover, the FinFET device region is formed such that it is oriented in the (110) direction, while the thinned FET device region is oriented in the (100) direction. Alternatively, the substrate is a (110) surface orientated wafer and the FinFET has a (100) surface orientation, while the planar single gated device has a (110) surface orientation.

In broad terms, the method of the present invention comprises the steps of:

providing a silicon-on-insulator structure comprising at least a top semiconductor layer located on a buried insulating layer, said top semiconductor layer having at least one patterned hard mask located in a FinFET region of the structure and at least one patterned hard mask located in a FET region of the structure;

protecting the FET region and trimming the at least one patterned hard mask in said FinFET region;

etching exposed portions of the top semiconductor that are not protected with said hard masks stopping on said buried insulating layer, said etching defining a FinFET active device region and a FET active device region, said FinFET active device region being perpendicular to the FET active device region;

protecting the FinFET active device region and thinning the FET active device region so that the FET device region has a height that is less than the height of the FinFET active device region;

forming a gate dielectric on each exposed vertical surface of the FinFET active device region, while forming a gate dielectric on an exposed horizontal surface of the FET device region; and forming a patterned gate electrode on each exposed surface of the gate dielectric.

The present invention also relates to an integrated semiconductor circuit that comprises at least one pFinFET and at least one nFET located atop a buried insulating layer of an silicon-on-insulator substrate, said at least one nFET is located on a surface of a top semiconductor layer of the silicon-on-insulator substrate and said at least one pFinFET has a vertical channel that is perpendicular to the at least one nFET. Alternatively, the integrated semiconductor circuit comprises at least one nFinFET and at least one pFET located atop a buried insulating layer of an silicon-on-insulator substrate, said at least one pFET is located on a surface of a top semiconductor layer of the silicon-on-insulator substrate and said at least one nFinFET has a vertical channel that is perpendicular to the at least one pFET.

Stated broadly, the integrated semiconductor circuit of the present invention comprises at least one FinFET and at least one planar single gated FET located atop a buried insulating layer of an silicon-on-insulator substrate, said at least one planar single gated FET comprising an active device region that includes a patterned top semiconductor layer of the silicon-on-insulator substrate and said at least one FinFET has a vertical channel that is perpendicular to the at least one planar single gated FET.

DETAILED DESCRIPTION

Figure 1:
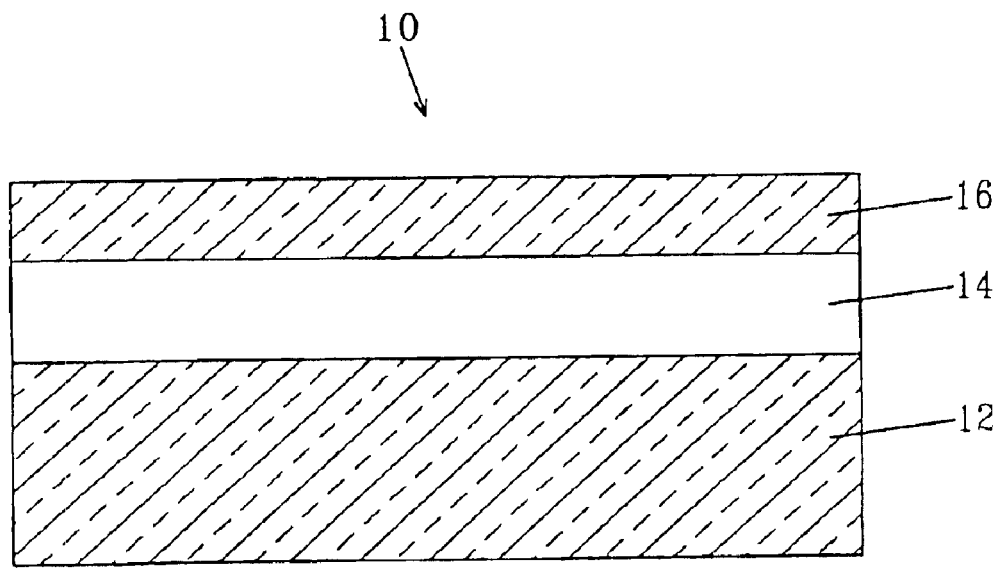
FIG. 1 is a pictorial representation (through a cross sectional view) illustrating a starting SOI substrate employed in the present invention.

The present invention, which provides hybrid planar and FinFET CMOS devices and a method of forming the same, will now be described in greater detail by referring to the drawings that accompany the present application. In the accompanying drawings, like and corresponding elements are referred to by like reference numerals. It should be noted that in the following description and drawings, a single nFET and a single pFinFET are shown. Although illustration is provided for a single nFET and a single pFinFET, the present invention works equally well for forming a plurality of each type of device on the SOI substrate. Additionally, the structures may be fabricated such that the vertical device is an nFinFET and the planar device is a pFET.

FIG. 1 illustrates an initial silicon-on-insulator (SOI) substrate 10 that may be used in the present invention. SOI substrate 10 includes a buried insulating region 14 that is positioned between a bottom semiconductor layer 12 and a top semiconductor layer 16. The top semiconductor layer 16 is sometimes referred to in the art as an SOI layer of an SOI substrate. The SOI layer is the layer of the SOI substrate in which active devices are typically built upon.

The term "semiconductor" as used herein to describe the bottom semiconductor layer 12 and the top semiconductor layer 16 denotes any semiconducting material including, for example, Si, Ge, SiGe, SiC, SiGeC, InAs, GaAs, InP or other like III/V compound semiconductors. Multilayers of these semiconductors are also contemplated herein. In a preferred embodiment, both semiconductor layers, i.e., the bottom semiconductor layer 12 and the top semiconductor layer 16 of the SOI substrate 10 are both comprised of Si.

The buried insulating layer 14 may be a crystalline or non-crystalline oxide or nitride. In a preferred embodiment of the present invention, the buried insulating layer 14 is an oxide. The buried insulating layer 14 may be continuous, as shown, or it may be discontinuous. When a discontinuous buried insulating region is present, the insulating region exists as isolated islands that are surrounded by semiconductor material. The SOI substrate 10 may be a standard (100) oriented wafer, a (110) oriented wafer, or any other surface orientation. A preferred orientation of the SOI substrate is the (100) surface orientation.

The SOI substrate 10 may be formed utilizing standard processes including for example, SIMOX (separation by ion implantation of oxygen) or bonding. When bonding is employed, an optional thinning step may follow the bonding process. The optional thinning step reduces the thickness of the top semiconductor layer to a layer having a thickness that is more desirable.

The thickness of the top semiconductor layer 16 of the SOI substrate 10 is from about 100 to about 1000 Å☐, with a thickness of from about 500 to about 700 Å☐ being more highly preferred. The buried insulating layer 14 of the SOI substrate 10 has a thickness of from about 10 to about 2000 Å, with a thickness of from about 1000 to about 1500 Å☐ being more highly preferred. The thickness of the bottom semiconductor layer 12 is inconsequential to the present invention.

Figure 2:
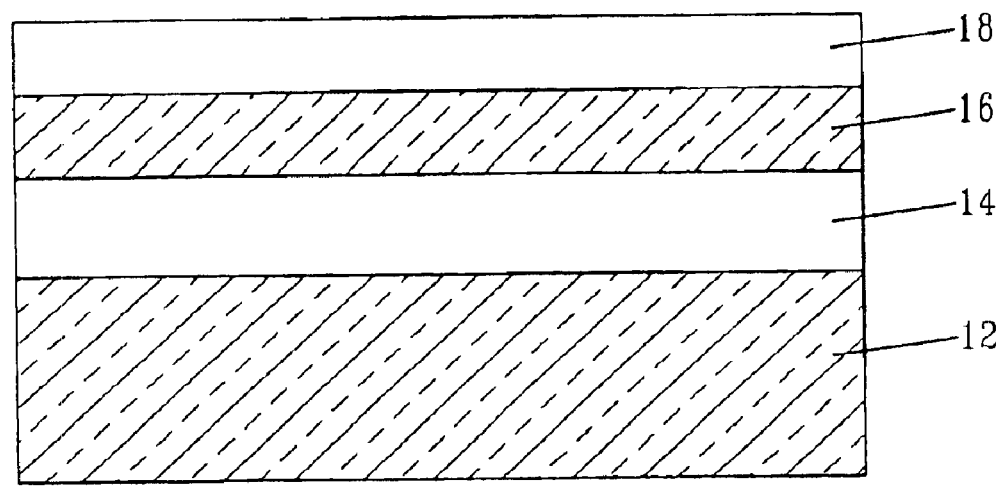
FIG. 2 is a pictorial representation (through a cross sectional view) illustrating a structure containing an oxide layer on an upper surface of the SOI substrate of FIG. 1.

Next, an oxide layer 18 is formed on an upper exposed surface of the top semiconductor layer 16 providing the structure shown, for example, in FIG. 2. Specifically, the oxide layer 18 is formed by subjecting the top semiconductor layer 16 of the SOI substrate 10 to an oxidation The oxidation process may be performed using a wet or dry thermal oxidation process. The oxidation process used at this point of the present invention is typically performed at a temperature of about 1000 Â° C. or above. Alternatively, the oxide layer 18 may be formed by a deposition process including, for example, chemical vapor deposition (CVD), plasma-assisted CVD or chemical solution deposition. The resultant structure including oxide layer 18 is shown, for example, in FIG. 2.

The thickness of the oxide layer 18 formed at this point of the present invention may vary depending on the conditions used to form the same. Typically, however, the oxide layer 18 has a thickness of from about 200 to about 800 Å☐, with a thickness of about 400 to about 600 Å☐ being more highly preferred. The oxide layer 18 is employed in the present invention as a hard mask during a subsequent Si etch to define the active regions as well as a protective layer to protect the FinFET during the gate stack etch and also during the spacer etch.

Figure 3:
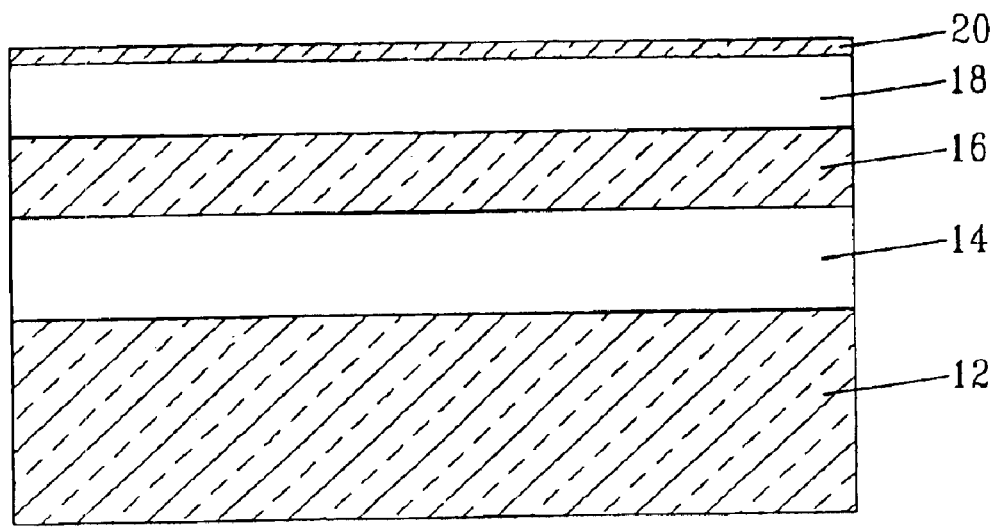
FIG. 3 is a pictorial representation (through a cross sectional view) illustrating a structure containing a cap layer located atop the structure shown in FIG. 2.

After forming the oxide layer 18 on the SOI substrate 10, a cap layer 20 comprising silicon is deposited on an exposed upper surface of the oxide layer 18. The resultant structure that is formed after depositing the cap layer 20 is shown, for example, in FIG. 3. The cap layer 20, which is formed by a deposition process such as a sputter etch process, is used to protect the oxide layer 18 during the FinFET trimming process. The cap layer 20 is typically thinner than the oxide layer 18. Specifically, the cap layer 20 has a thickness of from about 10 to about 500 Å☐, with a thickness of from about 50 to about 100 Å☐ being more highly preferred.

Figure 4:
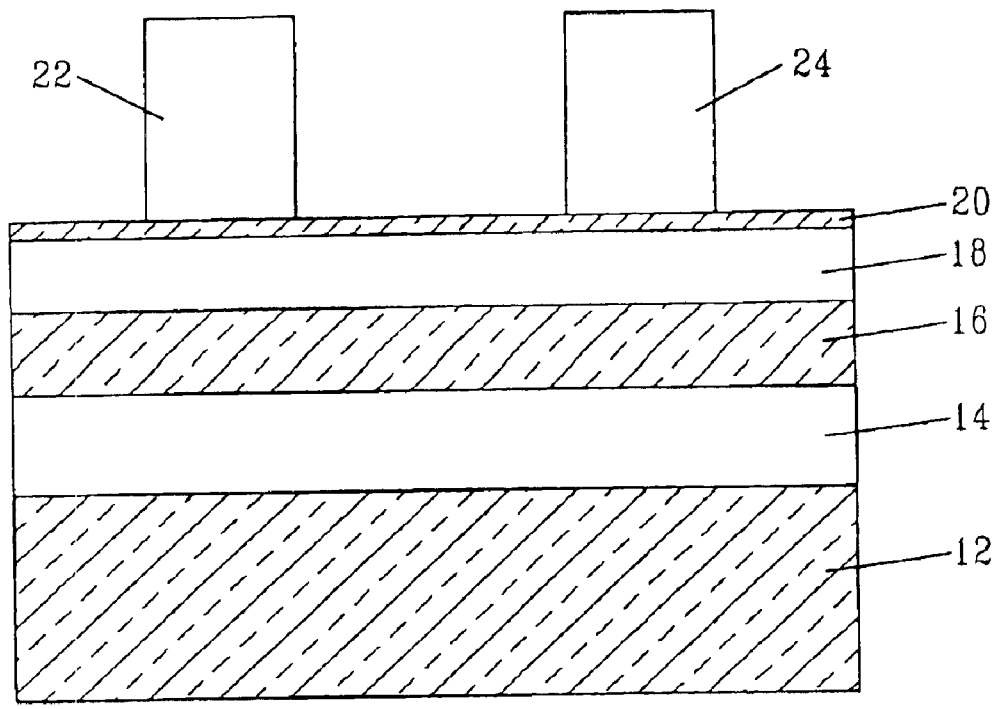
FIG. 4 is a pictorial representation (through a cross sectional view) illustrating a structure after lithography is used to form resist images for defining active device regions.

At this point of the present invention, lithography is used to pattern resist images for the pFinFET active device region and nFET active device region, or alternatively nFinFET and pFET. In particular, patterned resist image 22 (which defines the FinFET active device region) and patterned resist image 24 (which defines the FET active device region) are formed on predetermined portions of the cap layer 20. The patterned resist images 22 and 24 are formed by first applying a photoresist to the entire surface of cap layer 20, then exposing the photoresist to a desire radiation pattern, and thereafter developing the pattern into the exposed photoresist utilizing a conventional resist developer. The structure including the patterned photoresist images 22 and 24 is shown, for example, in FIG. 4.

Figure 5:
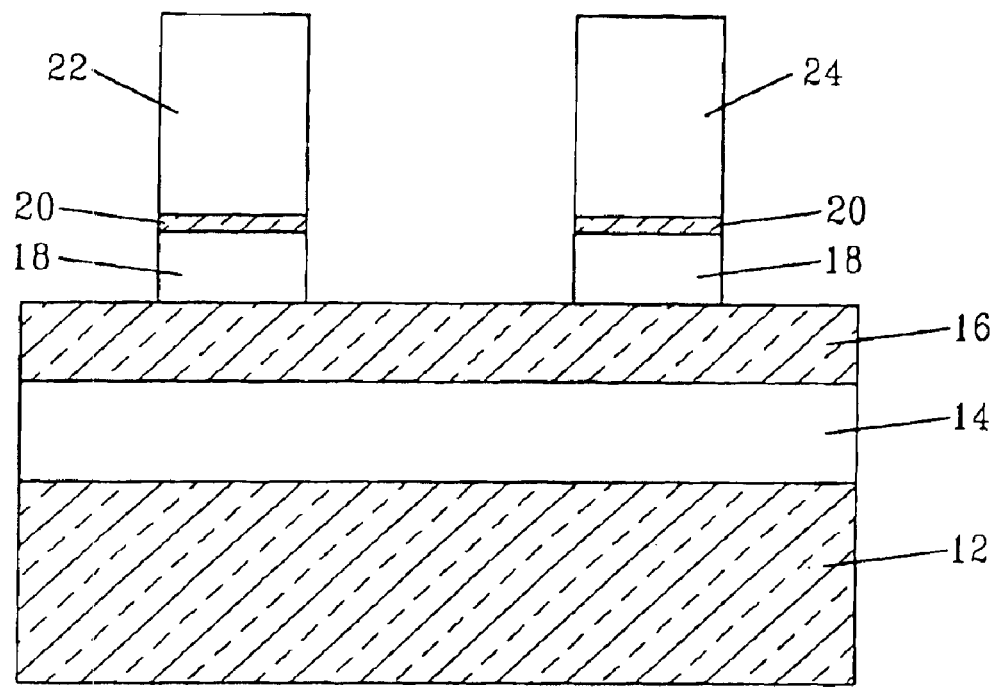
FIG. 5 is a pictorial representation (through a cross sectional view) illustrating a structure after the cap layer and the oxide layer are etched selective to the resist images.

Next, the cap layer 20 and the oxide layer 18 not protected by the resist images 22 and 24 are etched selective to the resist images to form hard mask patterns for the FinFET active region and the FET active region, respectively. The etching used in this step of the present invention is a directional reactive ion etch process or similar dry etch process that is capable of removing the cap layer 20 and the oxide layer 18 stopping on an upper surface of the top semiconductor layer 16. The resultant structure that is formed after this step of the present invention has been performed is shown, for example, in FIG. 5. Following the etching step, the resist images 22 and 24 are removed using a wet solvent stripping process or a standard ashing process known to those skilled in the art so as to expose hard mask pattern 26 and hard mask pattern 28. Hard mask pattern 26 is used in the present invention to define the active area for the FinFET, whereas hard mask pattern 28 is used in defining the active area for the planar single gated FET. A resist mask 30 is then formed in the region in which the planar single gated FET will be formed to provide the structure shown in FIG. 6.

Figure 6:
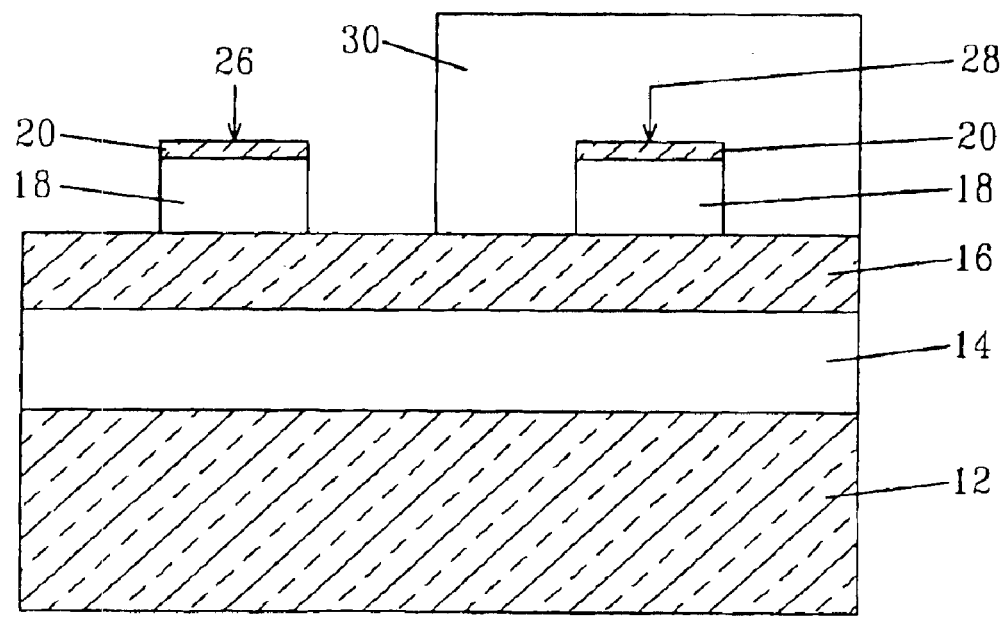
FIG. 6 is a pictorial representation (through a cross sectional view) illustrating a structure after removing the resist images and forming a resist image blocking the FET device region.

As shown in FIG. 6, the resist mask 30 covers the hard mask pattern 28 as well as portions of the top semiconductor layer 16 abutting the hard mask pattern 28. Resist mask 30 is formed by applying a photoresist to the structure shown in FIG. 5, and thereafter patterning the applied photoresist using lithography.

The hard mask pattern 26, particularly the oxide layer 18 of the hard mask pattern, for the FinFET (p or n) is then selectively trimmed using a chemical oxide removal process. The chemical oxide removal (COR) processing step comprises exposing the structure to a gaseous mixture of HF and ammonia at a pressure of about 30 mTorr or below, preferably at a pressure between about 1 mTorr and about 10 mTorr, and a temperature of about 25 Â° C. or a temperature slightly above room temperature. The ratio of gaseous HF to gaseous ammonia is from about 1:10 to about 10:1, with a ratio of about 2:1 being more highly preferred.

Alternatively, the hard mask pattern 26 for the FinFET is trimmed using a wet etch process in which a chemical etchant, such as hydrofluoric acid, that selectively removes oxide is employed.

Figure 7:
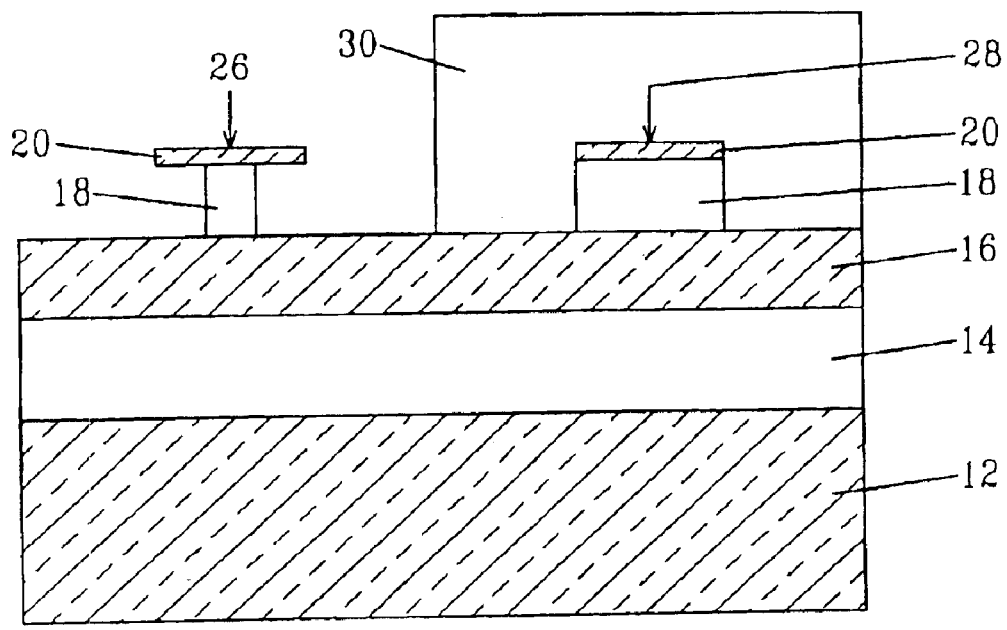
FIG. 7 is a pictorial representation (through a cross sectional view) illustrating a structure after the FinFET hard mask has been trimmed.

The resultant structure that is formed after the trimming step has been performed is shown, for example, in FIG. 7. As is illustrated in this figure, the oxide layer 18 of the hard mask pattern 26 is thinner than the overlying patterned cap layer 20 as well as the oxide layer of the hard mask pattern 28. After the trimming step, the resist mask 30 that blocked the FET device region is removed utilizing a conventional stripping process.

At this point of the present invention, a dry etching process such as reactive ion etching, plasma etching, ion beam etching or laser ablation is employed to etch the active regions for the FinFET and the FET. In particular, a dry etching process is employed to remove the cap layer 20 as well as the top semiconductor layer 16 that are not protected by either the trimmed hard mask pattern 26 or the hard mask pattern 28. The etching step used at this point of the present invention thus removes any unprotected silicon (or semiconductor material) from the structure stopping on buried insulating layer 14. The resultant structure is shown in FIG. 8.

Figure 8:
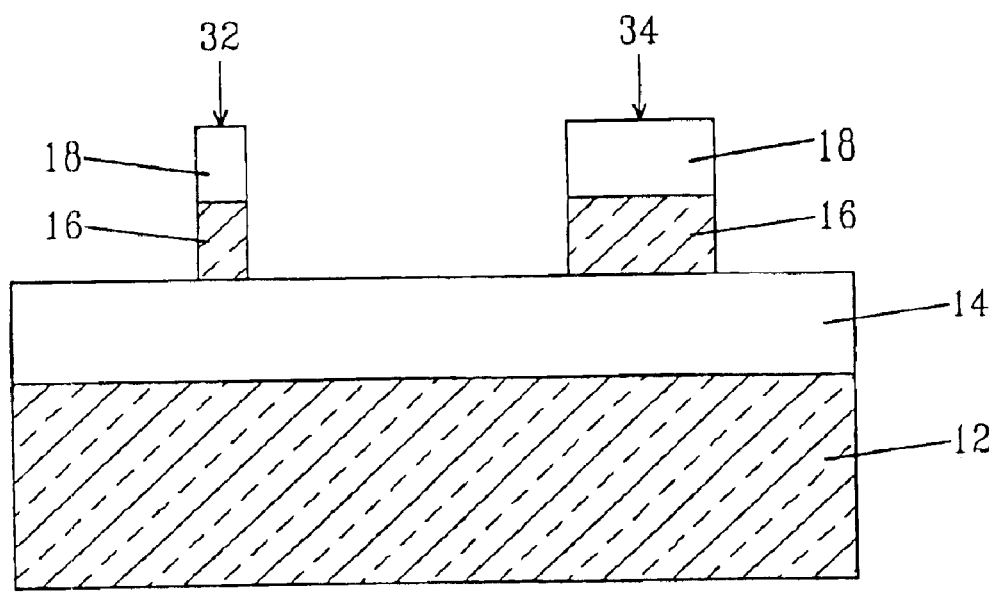
FIG. 8 is a pictorial representation (through a cross sectional view) illustrating a structure after removing the blocking mask and etching the exposed surfaces of the top semiconductor layer of the SOI substrate forming FinFET and FET active device regions.

In FIG. 8, reference numeral 32 denotes the active device region for the FinFET, whereas reference numeral 34 denotes the active device region for the planar single gated FET (p or n). Portions of the FinFET active device region will serve as the channel region of the FinFET (p or n). In one embodiment, the channel region of the pFinFET has a (110) surface orientation. Alternatively, if the starting wafer has a (110) surface orientation, the FinFET is an nFinFET having a (100) surface orientation, while the planar single gated device is a pFET having a (110) surface orientation.

Figure 9:
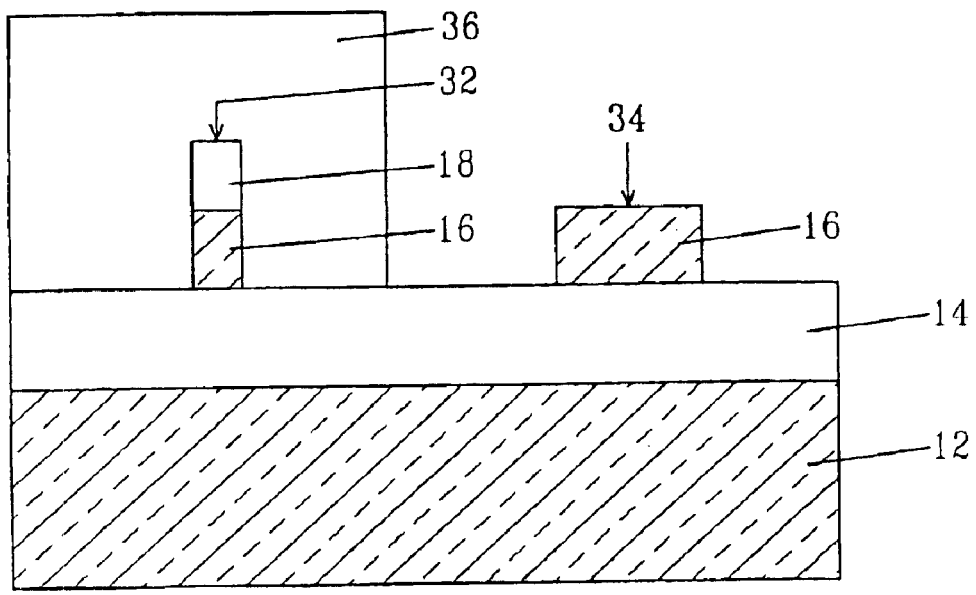
FIG. 9 is a pictorial representation (through a cross sectional view) illustrating a structure after blocking the FinFET active device region and removing the hard mask from the FET device region.

Another resist mask 36 is patterned over the FinFET region using a standard lithography process. Next, an etching process is used to selectively remove the oxide layer 18 of the patterned hard mask 28 over the FET active device region 34. The etching process used to remove the oxide layer 18 of the patterned hard mask 28 from the FET active device region 34 may include a wet chemical etching process or a dry etching process. The resultant structure after resist mask 36 formation and etching the patterned oxide layer 18 from the FET device region 34 is shown, for example, in FIG. 9.

Figure 10:
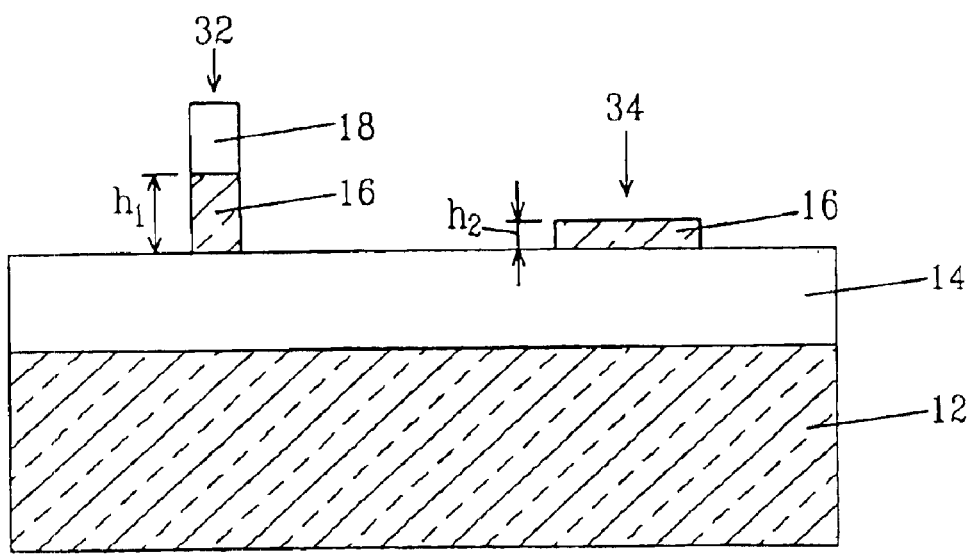
FIG. 10 is a pictorial representation (through a cross sectional view) illustrating a structure after the FET active device region has been thinned to a height that is less than the height of the FinFET active device region.

With resist mask 36 removed, the FET device region 34 may be thinned using an etching process that is highly selective to $SiO_2$. Alternatively, the resist mask may be left in place during the thinning process. The thinned FET active device region 34 is shown in FIG. 10. After thinning of the FET device region 34, the resist mask 36 is removed from the structure utilizing a conventional resist stripping process. It is noted that at this point of the present invention, the FinFET active device region 32 has a height, $h_1$, that is greater than the height, $h_2$, of the FET active device region 34. Another feature of the structure at this point of the sacrificial oxide layer formed at this point of the present invention may vary depending on the conditions of the oxidation process itself. Typically, however, the sacrificial oxide layer has a thickness of from about 30 to about 100 Å□. If desired, at this stage of the present invention, a block mask, not shown, may be patterned over the FET region and an ion implantation process may be performed to implant the FinFET channel regions to set the threshold voltage of the device. similar procedure may be performed to set the threshold voltage of the FET device. A conventional anneal process is then typically performed to activate the dopants.

The sacrificial oxide layer is then removed from the structure using a wet or dry etching process. Next, a gate dielectric 40 is formed on the exposed vertical surfaces of the FinFET active device region 32 and the exposed horizontal surface of the FET active device region 34. The gate dielectric 40 may comprise an oxide, nitride, oxynitride or any combination thereof. Preferably, the gate dielectric 40 is an oxide such as, but not limited to: $SiO_2$, $Al_2O_3$, perovskite oxides, or other like oxides. The gate dielectric 40 is formed utilizing a thermal oxidation, nitridation, or oxynitridation process. The thickness of the gate dielectric 40 is from about 0.5 to about 10 nm, with a thickness of from about 0.8 to about 1.0 nm being more highly preferred.

Figure 11:
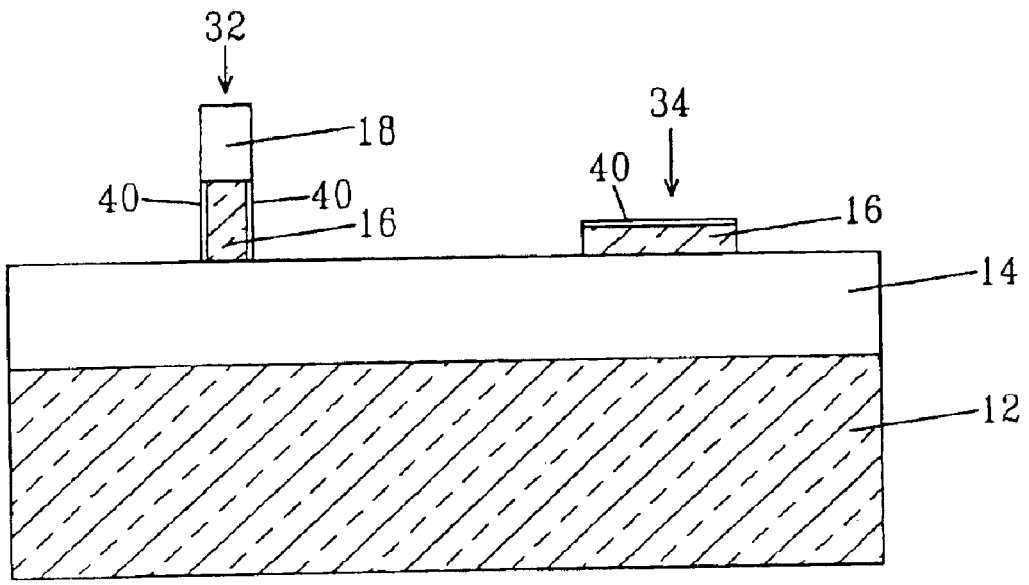
FIG. 11 is a pictorial representation (through a cross sectional view) illustrating a structure after a gate dielectric has been formed on vertical surfaces of the FinFET active device region and on a horizontal surface of the FET active device region.

The structure including the gate dielectric 40 is shown, for example, in FIG. 11. Note that the FinFET active device region 32 has two gate dielectrics formed on the exposed vertical surfaces, while the FET active device 34 has a single gate dielectric formed on the exposed horizontal surface thereof.

Figure 12:
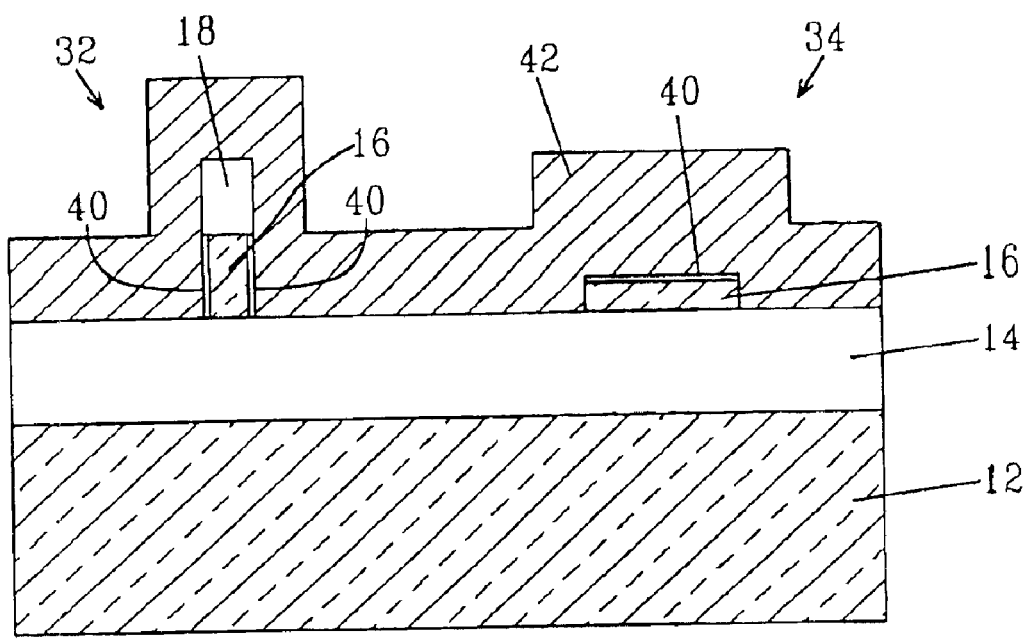
FIG. 12 is a pictorial representation (through a cross sectional view) illustrating a structure containing a deposited gate conductor material.

A gate conductor material 42 is then formed over the entire structure shown in FIG. 11 providing the structure shown, for example, in FIG. 12. The gate conductor material 42 is formed utilizing a conventional deposition process such as, for example, chemical vapor deposition (CVD), plasma-assisted CVD, evaporation, sputtering, chemical solution deposition, or atomic layer deposition. The gate conductor material 42 may comprise poly-Si; an elemental metal such as W; an alloy containing one or more elemental metals; a silicide; or a stack combination thereof, such as, for example, poly-Si/W or silicide.

Figure 13:
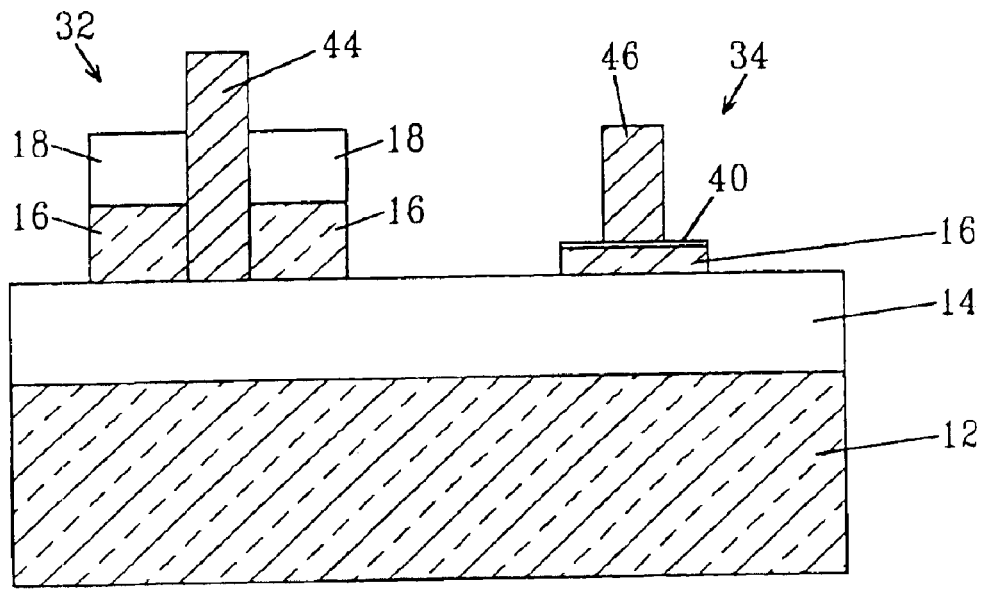
FIG. 13 is a pictorial representation (through a cross section perpendicular to the gate) illustrating a structure containing patterned gate electrodes.

Next, a lithographic process is used to pattern resist images over the gate conductor material. An etching process is then used to pattern the gate conductor material into gate electrodes for the FinFET and the FET. In FIG. 13, which is a cross sectional view perpendicular to the gate, the patterned gate electrode for the FinFET is labeled as 44, the patterned gate electrode for the FET is labeled as 46.

In some embodiments, it may be advantageous to pattern a hard mask over the gate electrode regions before the gate stack etch. The hard mask for the FinFET gate may be blocked using a lithography mask, and the FET gate stack may be etched selectively with respect to the lithography mask. The process may be repeated to etch the gate stack for the FinFET.

At this point of the present invention, not shown in the drawings, a resist mask is patterned over the FET region and a low energy ion implant process (on the order of 20 KeV or less) is used to implant, if desired, halo implants as well as extension implants for the FinFET region. A typical implant species for the optional FinFET halo implant may be arsenic. A typical implant for the FinFET extension may be boron or $BF_2$, if the FinFET is a p-type device. The resist mask is removed using a solvent stripping process or an oxygen ash process. Another resist mask (not shown) is next patterned over the FinFET region and the FET halo, if desired, and FET extensions are implanted using boron or indium for the optional halo implant, and arsenic for the FET extension in the case that the planar single gated FET is an nFET. The resist mask is removed using a conventional resist removal process.

Figure 14:
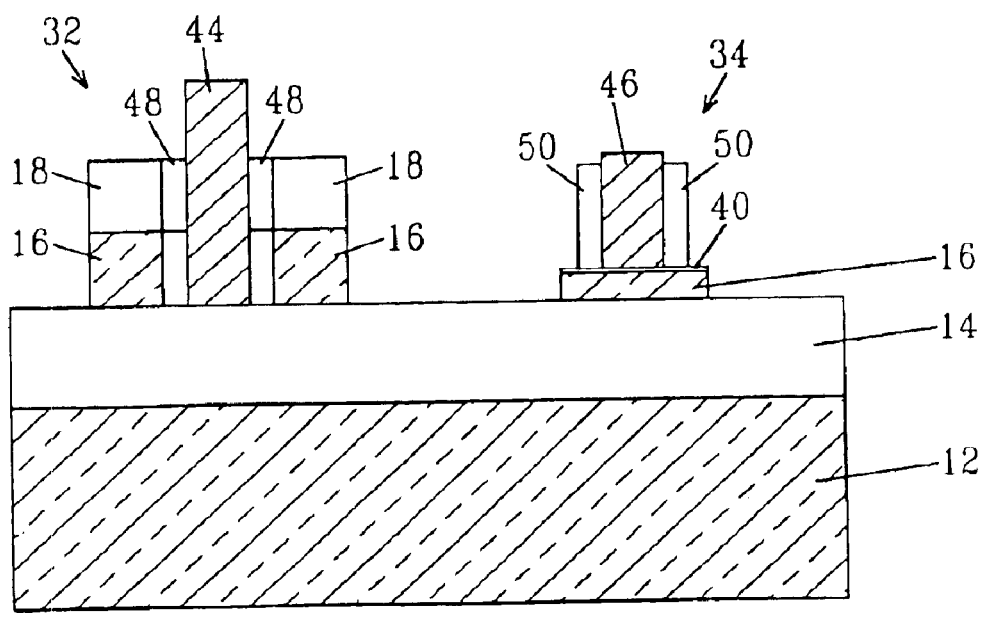
FIG. 14 is a pictorial representation (through a cross section perpendicular to the gate view) illustrating a final structure of the present invention.

A dielectric material, such as an oxide, nitride, oxynitride or any combination thereof, is deposited and a directional etching process is used to from source/drain spacers. In some embodiments, it may be advantageous to first deposit a thin oxide liner having a thickness of from about 35 to about 100 Å□, followed by deposition of a SiN layer having a thickness of from about 100 to about 700 Å□. An independent spacer etch process may be performed by using a resist mask to cover the FET, while the FinFET spacers 48 are formed and the FinFET may be protected by another resist mask while the FET spacers 50 are formed. The resultant structure including source/drain spacers 48 and 50 is shown, for example, in FIG. 14.

The source/drain implants (not shown in the drawings) are then formed for the FinFET and the FET using a conventional block mask and ion implantation. A layer of selective epitaxial Si may be grown on the source/drain regions before the implant to reduce parasitic resistance. A conventional rapid thermal anneal process may then be used to activate the junctions. Following activation of the source/drain junctions, a silicide process may be employed to create low resistance source/drain contact regions. A conventional interconnect process may be used to continue the process through the back end of the line.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an integrated semiconductor circuit comprising the steps of:

providing a silicon-on-insulator structure comprising at least a top semiconductor layer located on a buried insulating layer, said top semiconductor layer having at least one patterned hard mask located in a FinFET region of the structure and at least one patterned hard mask located in a FET region of the structure;

protecting the FET region and trimming the at least one patterned hard mask in said FinFET region, wherein each trimmed patterned hard mask in said FinFET region has a horizontal surface whose width is less than the width of that of each patterned hard mask in said FET region;

etching exposed portions of the top semiconductor that are not protected with said hard masks stopping on said buried insulating layer, said etching defining a FinFET active device region and a FET active device region, said FinFET active device region being perpendicular to the FET active device region;

protecting the FinFET active device region and thinning the FET active device region so that the FET device region has a height that is less than the height of the FinFET active device region;

forming a gate dielectric on each exposed vertical surface of the FinFET active device region, while farming a gate dielectric on an exposed horizontal surface of the FET device region; and forming a patterned gate electrode on each exposed surface of the gate dielectric.

2. The method of claim 1 further comprising forming spacers abutting the patterned gate electrode.

3. The method of claim 1 wherein said patterned hard masks are formed by the steps of: forming an oxide layer on a surface of the top semiconductor layer; forming a cap layer on the oxide layer; applying a photoresist to an exposed surface of the cap layer; exposing the photoresist to a pattern of radiation; developing the pattern into the photoresist; and transferring the pattern from the photoresist into the cap layer and the oxide layer.

4. The method of claim 1 wherein the protecting the FET region comprising applying a resist mask to the FET region.

5. The method of claim 1 wherein said trimming includes a chemical oxide removal process or a wet etch process.

6. The method of claim 1 wherein the FinFET active device region has a (110) surface orientation and the FET active device region has a (100) surface orientation.

7. The method of claim 1 wherein the protecting the FinFET active device region comprises applying a resist mask to the FinFET active device region.

8. The method of claim 1 wherein the FinFET active device region has a (100) surface orientation and the PET device region has a (110) surface orientation.

9. The method of claim 1 wherein said thinning includes an etching process that is highly selective to $SiO_2$.

10. The method of claim 1 wherein said gate dielectric is an oxide formed by a thermal oxidation process.

11. The method of claim 1 wherein said patterned gate electrodes are formed by depositing a gate conductor material; forming a patterned resist on top of the gate conductor material; and etching exposed portions of the gate conductor not protected with the patterned resist.

* * * * *